(12) United States Patent
von Styp-Rekowski et al.

(10) Patent No.: US 7,161,263 B2
(45) Date of Patent: Jan. 9, 2007

(54) LOW VOLTAGE LOW LOSS PIEZOELECTRIC DRIVER AND SWITCHING APPARATUS

(75) Inventors: Norman H. von Styp-Rekowski, Oakville (CA); Uwe D. Schaible, Ancaster (CA)

(73) Assignee: Marlex Engineering Inc., Ancaster (CA)

( * ) Notice: Subject to any disclaimer, the term of this patent is extended or adjusted under 35 U.S.C. 154(b) by 424 days.

(21) Appl. No.: 10/870,071

(22) Filed: Jun. 18, 2004

(65) Prior Publication Data

US 2005/0001513 A1    Jan. 6, 2005

Related U.S. Application Data

(60) Provisional application No. 60/479,060, filed on Jun. 18, 2003.

(51) Int. Cl.
*H01F 27/42*    (2006.01)
*H01F 37/00*    (2006.01)
*H01F 38/00*    (2006.01)

(52) U.S. Cl. ...................................................... 307/104
(58) Field of Classification Search ................ 307/104
See application file for complete search history.

(56) References Cited

U.S. PATENT DOCUMENTS 6,465,931 B1    10/2002    Knowles et al.
6,665,917 B1 *  12/2003    Knowles et al. ........... 29/25.35

OTHER PUBLICATIONS

U.S. Appl. No. 10/078,887, Jun. 27, 2002, Knowles et al.

* cited by examiner

*Primary Examiner*—Chau N. Nguyen
*Assistant Examiner*—Carlos Amaya
(74) *Attorney, Agent, or Firm*—R. Craig Armstrong; Borden Ladner Gervais LLP

(57) ABSTRACT

A piezoelectric driving and switching apparatus includes a power supply circuit having a supply open configuration and positive and negative closed configurations for transferring energy to an inductor. A piezoelectric circuit of the apparatus has a piezoelectric open configuration and a piezoelectric closed configuration whereat the energy is transferred between the inductor and a first piezoelectric load. The apparatus includes a capacitive circuit having a capacitive open configuration and a capacitive closed circuit configuration whereat the energy is transferred between the inductor and a capacitive load. A controller circuit of the apparatus includes a switch control for electrically switching each of the power supply circuit, the piezoelectric circuit, and the capacitive circuit to selectively and independently transfer the energy from the power supply to the first piezoelectric and capacitive loads, and a portion of the energy between the first piezoelectric and capacitive loads.

23 Claims, 14 Drawing Sheets

LOW VOLTAGE LOW LOSS PIEZOELECTRIC DRIVER AND SWITCHING APPARATUS

FIELD OF THE INVENTION

The present invention relates generally to a low voltage low loss driver for capacitive load systems, and more specifically, to a low voltage low loss piezoelectric driver and switching apparatus.

BACKGROUND OF THE INVENTION

It can be appreciated that Piezo element drivers have been in use for years. Typically, Piezo element drivers are comprised of transconductive mechanisms that develop mechanical force by utilizing the principles of either electrostriction or magnetostriction. These transconductive mechanisms can be utilized to perform highly efficient mechanical actuation as they return most of the energy transferred into the device. Energy losses are composed primarily of the actual energy required to produce the mechanical work. There are many power circuits known within the art that can be used to drive transconductive mechanisms. These include linear driver circuits that transfer the return energy from the transconductive mechanism to a non-regenerative load. Other driver circuits include regenerative capabilities that store the reverse energy from a transconductive mechanism into either a bypass supply capacitor, or into the symmetrically opposite half of the transconductive mechanism itself. Such circuits have been described in prior art related to the application of driving bimorph actuators. In such circuits, the load itself is assumed to be balanced and symmetric so that it can be used as an energy storage element in the energy balance of the overall system.

The main problem with conventional Piezo element drivers is that they are designed to drive only one side of a transconductive system. Such systems, when applied to a symmetrically coupled system such as a bimorph bender, produce large peaks in the power supply ripple current and are known to be inherently unstable. Circuits have been developed to specifically drive a symmetrically coupled system. These circuits, however, require the use of high side drivers and auxiliary high voltage power supplies. Another problem with conventional Piezo element drivers is that they require the use of a high voltage power supply to transfer energy to the transconductive system. The requirement for such a high voltage supply (typically in the range of 60V to several hundred volts) adds cost, complexity, and reliability issues to the overall system.

Existing products operate the transconductive system at a fixed power supply voltage and, in the case of a symmetrically coupled system such as a bimorph actuator, the total voltage (V) and thus the charge Q (where Q=CV) across the system capacitance (C) always remains constant. The sum of the voltages across each half of the bimorph is therefore always equal to V. Such an approach is limited to providing efficient energy regeneration in systems which only operate the bimorph actuator in a continuously alternating mode of deflection. Specifically, such an approach would fully charge one half of the bimorph, and then transfer all of that charge to the other half of the bimorph, resulting in a complete oscillation of the bimorph actuator between its full positive and full negative deflection state. The disadvantage of this approach is that efficient energy recovery cannot be accomplished if the bimorph actuator is to be operated independently in one direction or the other. For example, if the bimorph actuator is to be deflected in the positive direction, held there, and then returned to zero deflection in its equilibrated charge state, ½ of the energy stored in the transconductive element when at full deflection will have been lost as it is returned to zero deflection. This follows from the theoretical analysis that the energy (E) stored in such a transconductive system varies in proportion to the square of the voltage (E =½ CV$^2$) across its capacitance. If such a system were to have all of its energy stored in only one of the symmetric capacitive elements of the bimorph actuator, then the total energy stored in that element would be equal to $E_{TOT}=½ CV_{max}^2$, where $V_{max}$ is the maximum voltage of the power supply. If the bimorph actuator is to be returned to its equilibrated charge state, the charge from one half of the bimorph is transferred to the other half of the bimorph actuator until both halves are of equal charge, resulting in equal voltages of $V_{max}/2$ across each of the capacitive elements. The total energy stored in this equilibrated state is equal to $E_{TOT}=2*½*C*(V_{max}/2)^2$, or $E_{TOT}=¼ CV^2$. Hence, only one half of the energy stored in the fully positive deflection state of the bimorph actuator is actually transferred to the equilibrated state, while the remaining energy must be temporarily stored by some other means, or be dissipated as losses. Deflecting the bimorph actuator to either its fully positive or fully negative deflected state would require the addition of ¼ CV$^2$ of energy from the power supply or said alternate temporary means of energy storage. Such means of energy transfer can be greatly improved by not restricting the voltage across the bimorph to the power supply voltage, thereby allowing for a complete transfer of energy between its fully positive, equilibrated, and fully negative deflected states.

Another problem with conventional Piezo element drivers is that they utilize the approach of a fixed frequency of switching of the energy between the symmetric loads (in hundreds of kilohertz) and modulate the duty cycle (percentage of ON time) at that switching frequency to control the balance of energy in the system. This approach results in higher driver circuit switching loss than that created using a lower switching frequency or 'Switch As Required' (SAR) approach.

While these devices may be suitable for the particular purpose to which they address, they are not as suitable for providing an energy efficient switching topology that allows measured amounts of energy to be transferred to the inductive element from either a capacitive load or a low voltage supply.

The general purpose of the present invention, which will be described subsequently in greater detail, is to provide a new low voltage, low loss driver for capacitive load systems that has many of the advantages of the Piezo element driver systems mentioned heretofore and many novel features that result in a new low voltage low loss driver for capacitive load systems which are not anticipated, rendered obvious, suggested, or even implied by any of the prior art, either alone or in any combination thereof.

A primary object of the present invention is to provide a low voltage low loss driver for capacitive load systems that will overcome the shortcomings of the prior art devices.

An object of one aspect of the present invention is to provide a switching topology that allows measured amounts of energy to be transferred to an inductive element from either a capacitive load or a low voltage supply through the use of low voltage control signals, and will then automatically deliver that energy to an appropriate capacitive load.

An object of another aspect of the invention is to provide a low loss energy transfer circuit to transfer energy from one high voltage piezoelectric or capacitive load to another high voltage piezoelectric or capacitive load, with a common electrical center point, without the need for high voltage driver circuits to drive the switching elements that control the transfer.

An object of a further aspect of the invention is to provide a low loss means to increase the charge on either of the piezoelectric or capacitive loads to an arbitrary value within their rated maximum range without the use of a high voltage power supply.

Another object of one embodiment of the invention is to meet the preceding two objectives using a single inductive element to mediate the transfer of energy between the two piezoelectric or capacitive loads and to mediate the transfer of energy from a dual polarity low voltage supply to either of the two piezoelectric or capacitive loads.

An object of another aspect of the invention is to provide feedback signals to allow the precise control of energy transfer under dynamic operating conditions.

Another object is to allow the control of a bimorph piezoelectric actuator, a monomorph piezoelectric actuator and capacitor combination, a dual monomorph piezoelectric actuator configuration as the capacitive loads in the circuit, or a multimorph piezoelectric actuator with low losses during movement of the piezoactuator(s) and energy recovery through the energy transfer mechanism of the circuit.

Other objects and advantages of the present invention will become obvious to the reader, and it is intended that these objects and advantages are within the scope of the present invention.

To the accomplishment of the above and related objects, this invention may be embodied in the form illustrated in the accompanying drawings, attention being called to the fact, however, that the drawings are illustrative only, and that changes may be made in the specific construction illustrated.

SUMMARY OF THE INVENTION

In accordance with the present invention, there is disclosed a piezoelectric driving and switching apparatus comprising a power supply circuit, a piezoelectric circuit, a capacitive circuit, and a controller circuit. The power supply circuit comprises an inductor electrically coupled to a low voltage power supply having ground referenced positive and negative supply portions, and to a supply switching means for switching the power supply circuit between a supply open circuit configuration, a positive closed circuit configuration, and a negative closed circuit configuration. In the positive closed circuit configuration, a positive electric potential is applied to the inductor so as to force a positive direction current flow through the inductor and so as to transfer an energy thereto. In the negative closed circuit configuration, a negative electric potential is applied to the inductor so as to force a negative direction current flow through the inductor and so as to transfer the energy thereto. The piezoelectric circuit comprises a first piezoelectric load electrically coupled to the inductor and to a piezoelectric switching means for switching the piezoelectric circuit between a piezoelectric open circuit configuration, and a piezoelectric closed circuit configuration. In the piezoelectric closed circuit configuration, the energy is transferable from the inductor to the piezoelectric load when a first direction current flow of the positive direction current flow and the negative direction current flow is produced in the inductor, and the energy is transferable from the piezoelectric load to the inductor when a respective other direction current flow of the positive direction current flow and the negative direction current flow is produced in the inductor. The capacitive circuit comprises a capacitive load electrically coupled to the inductor and to a capacitive switching means for switching the capacitive circuit between a capacitive open circuit configuration, and a capacitive closed circuit. In the capacitive closed circuit configuration, the energy is transferable from the inductor to the capacitive load when the respective other direction current flow is produced in the inductor, and the energy is transferable from the capacitive load to the inductor when the first direction current flow is produced in the inductor. The controller circuit comprises a switch control means for transmitting low voltage ground referenced switch signals to the supply switching means, the piezoelectric switching means, and the capacitive switching means so as to selectively and independently transfer: the energy from the power supply to the first piezoelectric load; a portion of the energy from the capacitive load to the first piezoelectric load; the energy from the power supply to the capacitive load; and a portion of the energy from the piezoelectric load to the capacitive load.

According to the preferred embodiment of the invention, in transferring the portion of the energy from the first piezoelectric load to the capacitive load as aforesaid, the switch control means transmits a closing piezoelectric switch signal to the piezoelectric switch means such that the piezoelectric circuit is switched to the piezoelectric closed circuit configuration. The respective other direction current flow is then produced in the inductor, and the portion of the energy is directly transferred from the piezoelectric load to the inductor. Then, the switch control means transmits a piezoelectric opening switch signal to the piezoelectric switch means such that the piezoelectric circuit is switched to the piezoelectric open circuit configuration. The respective other direction current flow is produced in the inductor and the capacitive circuit is switched to the capacitive closed circuit configuration, such that the portion of the energy is directly transferred from the inductor to the capacitive load.

According to another aspect of the preferred embodiment of the invention, in transferring the portion of the energy from the capacitive load to the first piezoelectric load as aforesaid, the switch control means transmits a capacitive closing switch signal to the capacitive switch means such that the capacitive circuit is switched to the capacitive closed circuit configuration. The first direction current flow is then produced in the inductor, and the portion of the energy is directly transferred from the capacitive load to the inductor. The switch control means then transmits a capacitive opening switch signal to the capacitive switch means such that the capacitive circuit is switched to the capacitive open circuit configuration. The first direction current flow is produced in the inductor and the piezoelectric circuit is switched to the piezoelectric closed circuit configuration, such that the portion of the energy is directly transferred from the inductor to the piezoelectric load.

According to a further aspect of the preferred embodiment of the invention, in transferring the energy from the power supply to the first piezoelectric load as aforesaid, the switch control means transmits a first closing switch signal to the supply switching means such that the power supply circuit is switched to a first supply closed circuit configuration of the positive closed circuit configuration and the negative closed circuit configuration. The first direction current flow is then produced in the inductor, and the energy is transferred from the power supply to the inductor. Then, the switch control means transmits a supply opening switch signal to the supply switching means such that the power supply circuit is switched to the supply open circuit configuration. The first direction current flow is produced in the inductor and the piezoelectric circuit is switched to the piezoelectric closed circuit configuration, such that the energy is transferred from the inductor to the first piezoelectric load.

According to yet another aspect of the preferred embodiment of the invention, in transferring the energy from the power supply to the capacitive load as aforesaid, the switch control means transmits a second closing switch signal to the supply switching means such that the power supply circuit is switched to a respective other supply closed circuit configuration of the positive closed circuit configuration and the negative closed circuit configuration. The respective other direction current flow is then produced in the inductor, and the energy is transferred from the power supply to the inductor. Then, the switch control means transmits a supply opening switch signal to the supply switching means such that the power supply circuit is switched to the supply open circuit configuration. The respective other direction current flow is produced in the inductor and the capacitive circuit is switched to the capacitive closed circuit configuration, such that the energy is transferred from the inductor to the capacitive load.

According to still another aspect of the preferred embodiment of the invention, the piezoelectric switching means comprises a piezoelectric manual switch portion adapted to receive the switch signals from the switch control means, and a piezoelectric automatic switch portion. The piezoelectric automatic switch portion is adapted to automatically switch the piezoelectric circuit to the piezoelectric closed circuit configuration, when the first direction current flow is produced in the inductor and the power supply circuit and the capacitive circuit are respectively in the supply open circuit configuration and the capacitive open circuit configuration.

According to a yet further aspect of the preferred embodiment of the invention, the capacitive switching means comprises a capacitive manual switch portion adapted to receive the switch signals from the switch control means, and a capacitive automatic switch portion. The capacitive automatic switch portion is adapted to automatically switch the capacitive switching circuit to the capacitive closed circuit configuration, when the respective other direction current flow is produced in the inductor and the power supply circuit and the capacitive circuit are respectively in the supply open circuit configuration and the capacitive open circuit configuration.

According to a still further aspect of the preferred embodiment of the invention, the supply switching means comprises a positive switching means for switching the power supply circuit to the positive closed circuit configuration, and a negative switching means for switching the power supply circuit to the negative closed circuit configuration.

According to another aspect of an alternate embodiment of the invention, the controller circuit further comprises a timer means electrically coupled to the switch control means. The timer means automatically and independently transmits one of the piezoelectric opening switch signal, the capacitive opening switch signal, and the supply opening switch signal, following expiry of a measured time delay period in a corresponding one of the piezoelectric closed circuit configuration, the capacitive closed circuit configuration, and the first closed circuit configuration and the second closed circuit configuration.

According to another aspect of the preferred embodiment of the invention, the controller circuit further comprises feedback means for transmitting low voltage ground referenced electric potential measurement signals in respect of each of the capacitor, the first piezoelectric load, and the capacitive load to the switch control means. Responsive to the electric potential measurement signals, the switch control means automatically and independently transmits one of the supply opening switch signal, the capacitive opening switch signal, and the piezoelectric opening switch signal.

According to yet still another aspect of the preferred embodiment of the invention, the piezoelectric manual switch portion is selected from the group consisting of a bipolar transistor, a field-effect transistor, a bilateral switch, an analog switch, a relay, a silicon controlled rectifier, and a triac circuit. The piezoelectric automatic switch portion comprises a first diode in anti-parallel relation with the piezoelectric manual switch portion.

According to a yet still further aspect of the preferred embodiment of the invention, the capacitive manual switch portion is selected from the group consisting of a bipolar transistor, a field-effect transistor, a bilateral switch, an analog switch, a relay, a silicon controlled rectifier, and a triac circuit. The capacitive automatic switch portion comprises a second diode in anti-parallel relation with the capacitive manual switch portion.

According to another aspect of the preferred embodiment of the invention, the piezoelectric manual switch portion comprises the field-effect transistor, namely, a first MOSFET.

According to a further aspect of the invention, the capacitive manual switch portion comprises the field-effect transistor, namely, a second MOSFET.

According to yet another aspect of the invention, the first MOSFET comprises an N-channel MOSFET such that the first direction current flow comprises the positive direction current flow, and such that the first supply closed circuit configuration comprises the positive closed circuit configuration. The second MOSFET comprises a P-channel MOSFET such that the respective other direction current flow comprises the negative direction current flow, and such that the first supply closed circuit configuration comprises the negative closed circuit configuration.

According to another aspect of the preferred embodiment of the invention, the positive switching means comprises a P-channel MOSFET in series relation with a first blocking diode, and the negative switching means comprises an N-channel MOSFET in series relation with a second blocking diode.

According to a further aspect of the preferred embodiment of the invention, the capacitive load comprises a second piezoelectric load.

According to another aspect of the invention, the first piezoelectric load comprises a first monomorph bender and the second piezoelectric load comprises a second monomorph bender. Alternately, the first piezoelectric load comprises a first bending portion of a bimorph bender and the second piezoelectric load comprises a second bending portion of the bimorph bender.

According to another aspect of a further alternate embodiment of the invention, the apparatus further comprises a third piezoelectric circuit. The third piezoelectric circuit comprises a third piezoelectric load electrically coupled to the inductor, in parallel relation with the piezoelectric circuit and the capacitive circuit, and to a third piezoelectric switching means. The third piezoelectric switching means switches the third piezoelectric circuit between a third piezoelectric open circuit configuration, and a third piezoelectric closed circuit configuration whereat the energy is transferable from the inductor to the third piezoelectric circuit load. Each of the first piezoelectric load, the second piezoelectric load, and the third piezoelectric load is selected from the group consisting of a monomorph bender and a bending portion of a bimorph bender.

According to another aspect of the preferred embodiment of the invention, controller circuit has a circuit design selected from the group consisting of a microprocessor, a microcontroller, a digital signal processor, a complex programmable logic device, a field-programmable gate array, an application-specific integrated circuit, a discrete digital logic circuit, a discrete analog logic circuit, and a mixed digital and analog circuit.

According to a further aspect of the preferred embodiment of the invention, each of the positive and negative supply portions of the power supply switching circuit further comprises a respective supply capacitor electrically coupled between the power supply and the inductor.

According to still another aspect of the preferred embodiment of the invention, the low voltage power supply comprises a split direct current power supply.

In accordance with the present invention, and in view of the foregoing disadvantages inherent in the known types of Piezo element drivers now present in the prior art, there is disclosed a new low voltage, low loss driver for capacitive load systems wherein the same can be utilized to provide a switching topology that allows measured amounts of energy to be transferred into an inductive element from either a piezoelectric or a capacitive load, or a low voltage supply, through the use of low voltage control signals, and then automatically delivers that energy to an appropriate piezoelectric or capacitive load.

The present invention generally comprises a low voltage power supply, an inductor, a switching circuit for transferring energy from the low voltage power supply to the inductor, a switching circuit for transferring energy from the inductor to the capacitive load, and a controller to measure feedback signals and generate the appropriate switching signals. The power supply comprises of split low voltage DC power source. Each half of the power supply is referenced to ground in order to generate a positive and negative potential from which energy can be supplied to the inductor.

The inductor is used to temporarily store energy from either the low voltage power supply (before transferring it to the capacitive load) or from one half of the piezoelectric or capacitive load to the other. The use of an inductor allows the energy at the lower voltage potential of the power supply to be boosted into the higher potential piezoelectric or capacitive load. It also allows for the direct transfer of energy between the piezoelectric and capacitive loads.

The power supply switch circuit is used to control the flow of energy from the low voltage power supply to the inductor. The state and timing of the power supply switches determines the amount and direction of the energy transferred from the low voltage power supply.

The energy transfer switch circuit is used to control the flow of energy between the inductor and the piezoelectric and capacitive loads. The state and timing of the energy transfer switches determines the amount and direction of energy transferred to and from the piezoelectric and capacitive loads.

The controller is used to determine the switching state and timing of both the power supply and the energy transfer switch circuits. Feedback signals from the piezoelectric and capacitive loads and from the inductor are utilized by the controller to optimize the energy transfer throughout the system.

The present invention provides a switching topology that allows measured amounts of energy to be transferred into an inductive element or inductor from either of the piezoelectric and capacitive loads and from a low voltage supply through the use of low voltage control signals, and then automatically delivers that energy to the appropriate piezoelectric and capacitive loads. Except for leakage losses in the piezoelectric and capacitive loads themselves, the only other losses occur during energy transfers. These losses are comprised of losses in the switching device, losses in the inductive element, additional losses in the piezoelectric and capacitive loads due to effective series resistance, and any energy that is converted to mechanical energy.

The present invention also provides measurement feedback signals that may be measured using standard analog to digital conversion technology or, where less precise control is required, using several comparator circuits. Feedback also allows larger energy transfers to be performed as a series of smaller energy transfers. This allows the inductive element to be physically smaller at the expense of longer total transfer times.

The present invention does not require a high voltage supply to generate the high voltage required by the piezoelectric and capacitive loads, thus making it ideal for driving piezoelectric actuators from low voltage, low power, and battery operated supplies. The application of low voltage across the inductor builds up energy in the inductor for as long as the voltage is applied and is limited primarily due to magnetic saturation of the inductor's core and the current limit of the power supply. When this voltage is removed, the energy stored in the inductor is transferred to the appropriate one of the piezoelectric and capacitive loads through a diode acting as a one way switch. The inductor transforms the energy to the required voltage and current to charge up the piezoelectric and capacitive loads.

The ground point chosen in the present invention, and the use of complementary polarity switching devices in the circuit, allow all control switching to be accomplished with only the dual polarity low voltage supply. No high side drivers or auxiliary high voltage power supplies, as commonly used in related arts, are required.

The present invention is applicable to a wide range of piezoelectric actuators including bimorph actuators, monomorph actuators, and multimorph actuators. The energy transfer capabilities of the invention allows the energy in the two halves of a bimorph actuator, in a monomorph actuator and capacitor, between two monomorph actuators, and within and between multimorph actuators to be redistributed causing the actuators to move. The additional energy required to replenish the electrical energy that was converted into mechanical energy and any other losses in the system, is then provided by the low voltage supply.

There has thus been outlined, rather broadly, some of the more important features of the invention in order that the detailed description thereof may be better understood, and in order that the present contribution to the art may be better appreciated. Naturally, there are additional features of the invention that will be described hereinafter.

In this respect, and before explaining at least one embodiment of the invention in detail, it is to be understood that the invention is not limited in its application to the details of construction and to the arrangements of the components set forth in the following description or illustrated in the figures.

The invention is capable of other embodiments and of being practiced and carried out in various ways. Also, it is to be understood that the terminology employed herein is for the purpose of the description and should not be regarded as limiting.

Other advantages, features and characteristics of the present invention, as well as methods of operation and functions of the related elements of the structure, and the combination of parts and economies of manufacture, will become more apparent upon consideration of the following detailed description and the appended claims with reference to the accompanying drawings, the latter of which is briefly described hereinbelow.

BRIEF DESCRIPTION OF THE DRAWINGS

The novel features which are believed to be characteristic of the piezoelectric drive and switching apparatus according to the present invention, as to its structure, organization, use and method of operation, together with further objectives and advantages thereof, will be better understood from the following drawings in which like reference characters designate the same or similar parts throughout the several views, and in which presently preferred embodiments of the invention will now be illustrated by way of example. It is expressly understood, however, that the drawings are for the purpose of illustration and description only, and are not intended as a definition of the limits of the invention. In the accompanying drawings.

DETAILED DESCRIPTION OF A PREFERRED EMBODIMENT

Figure 1:
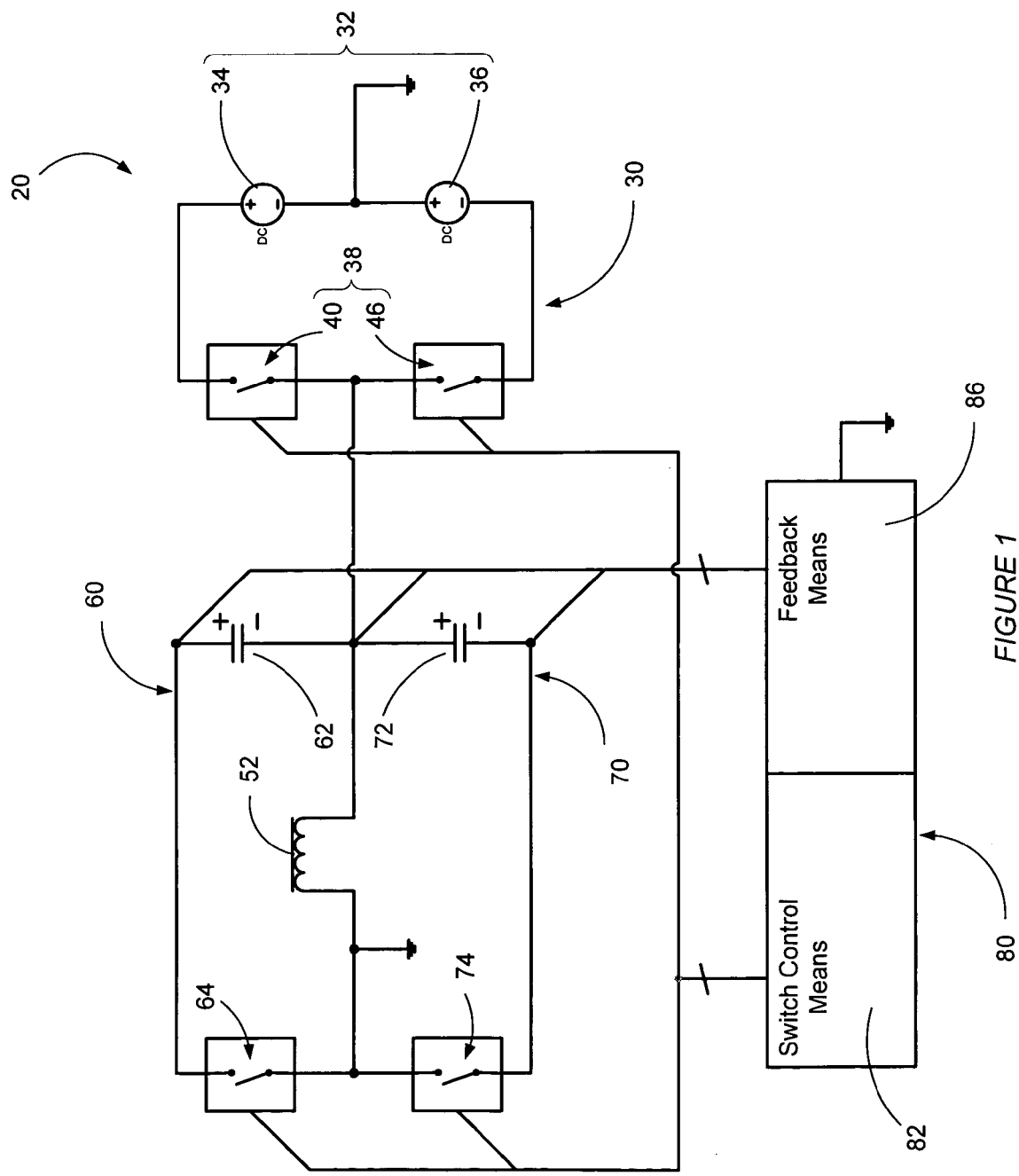
FIG. 1 is a basic circuit diagram of a preferred piezoelectric driving and switching apparatus according to the invention.

Referring now to the figures, in which similar reference characters denote similar elements throughout the several views, the attached figures illustrate a low voltage low loss driver for capacitive load systems, and more specifically a low voltage low loss piezoelectric driver and switch apparatus 20 which is comprised of a power supply circuit 30 including a low voltage power supply 32, an inductor 52, and a supply switching means 38 for transferring energy from the low voltage power supply 32 to the inductor 52. The apparatus 20 also comprises a piezoelectric circuit 60 which includes a piezoelectric switching means 64 for transferring energy from the inductor 52 to a first piezoelectric load 62, as well as a capacitive circuit 70 which includes a capacitive switching means 74 for transferring energy from the inductor 52 to a capacitive load 72. The apparatus 20 also comprises a controller circuit 80 to measure feedback signals and generate the appropriate switching signals.

The power supply 32 comprises a positive supply portion 34 and a negative supply portion 36, and preferably consists of split low voltage DC power source (as shown in FIG. 1). Each half of the power supply 32 is referenced to ground in order to generate a positive and negative potential from which energy can be supplied to the inductor 52. The split power supply 32 is sized to allow sufficient energy to be transferred to overcome the losses of the system (not shown). When used as a driver circuit for a bimorph bender or actuator, the power supply 32 need only supply power levels in the order of milliwatts. The low voltage power supply 32 for this invention might, for example, be two 3.3V lithium batteries. Such a configuration would provide the necessary split low voltage DC power supply 32. By way of another example, the power supply circuit 30 might use two voltage regulators to split the voltage from another power supply 32 such as a battery, solar panel, generator, AC adapter, or current loop derived voltage source into positive and negative supply portions 34, 36.

The inductor 52 is used to temporarily store energy from the low voltage power supply 32 (before transferring it to one of the piezoelectric and capacitive loads 62, 72), or from either of the first piezoelectric load 62 and the capacitive load 72 before transferring it to the other. The use of an inductor 52 allows the energy at the lower voltage potential of the power supply 32 to be boosted into the higher potential piezoelectric and capacitive loads 62, 72. It also allows for the direct transfer of energy between the piezoelectric and capacitive loads 62, 72. The inductor 52 sizing is specified by the rate and magnitude of the energy transfer. A rapid transfer of a large amount of energy will necessitate a lower inductance and a higher peak current handling capability. Hence, the number of turns and the core size of the inductor 52 must be tailored to the desired energy transfer characteristics of the system. The inductor 52 used in the apparatus 20 can be any one of the readily available forms and configurations manufactured in industry.

The supply switching means 38 is used to control the flow of energy from the low voltage power supply 32 to the inductor 52. The state and timing of a positive switching means 40 and a negative switching means 46 of the supply switching means 38 determines the amount and direction of the energy being transferred from the low voltage power supply 32. The supply switching means 38 is controlled via the controller circuit 80 and each of the positive switching means 40 and the negative switching means 46 is operated as either fully open or fully closed. Switch signals from the controller circuit 80 to the supply switching means 38 are ground referenced, and limited to the maximum positive and negative voltages of the split power supply 32. The need for isolated control circuitry and a buffered high voltage interface is eliminated in this system. Each of the positive switching means 40 and the negative switching means 46 may be a bipolar transistor, MOSFET, IGBT, bilateral switch, or analog switch in series with a diode. Other embodiments include a relay, an SCR, or a Triac circuit. In each of the embodiments shown in FIGS. 8 through 10, the positive switching means 40 and the negative switching means 46 each comprises a MOSFET 42, 48, in series with a respective blocking diode 44, 50.

The piezoelectric switching means 64 is used to control the flow of energy between the inductor 52 and the first piezoelectric load 62. The state and timing of the piezoelectric switching means 64 determines the amount and direction of energy transferred to and from the piezoelectric load 62. As shown in FIG. 1, the piezoelectric switching means 64 is controlled via the controller circuit 80 and it is operated as either fully open or fully closed. As with the supply switching means 38, switch signals to the piezoelectric switching means 64 are ground referenced, and limited to the maximum positive and negative voltages of the split power supply 32. The need for isolated control circuitry and a buffered high voltage interface is eliminated in this system.

Figure 8:
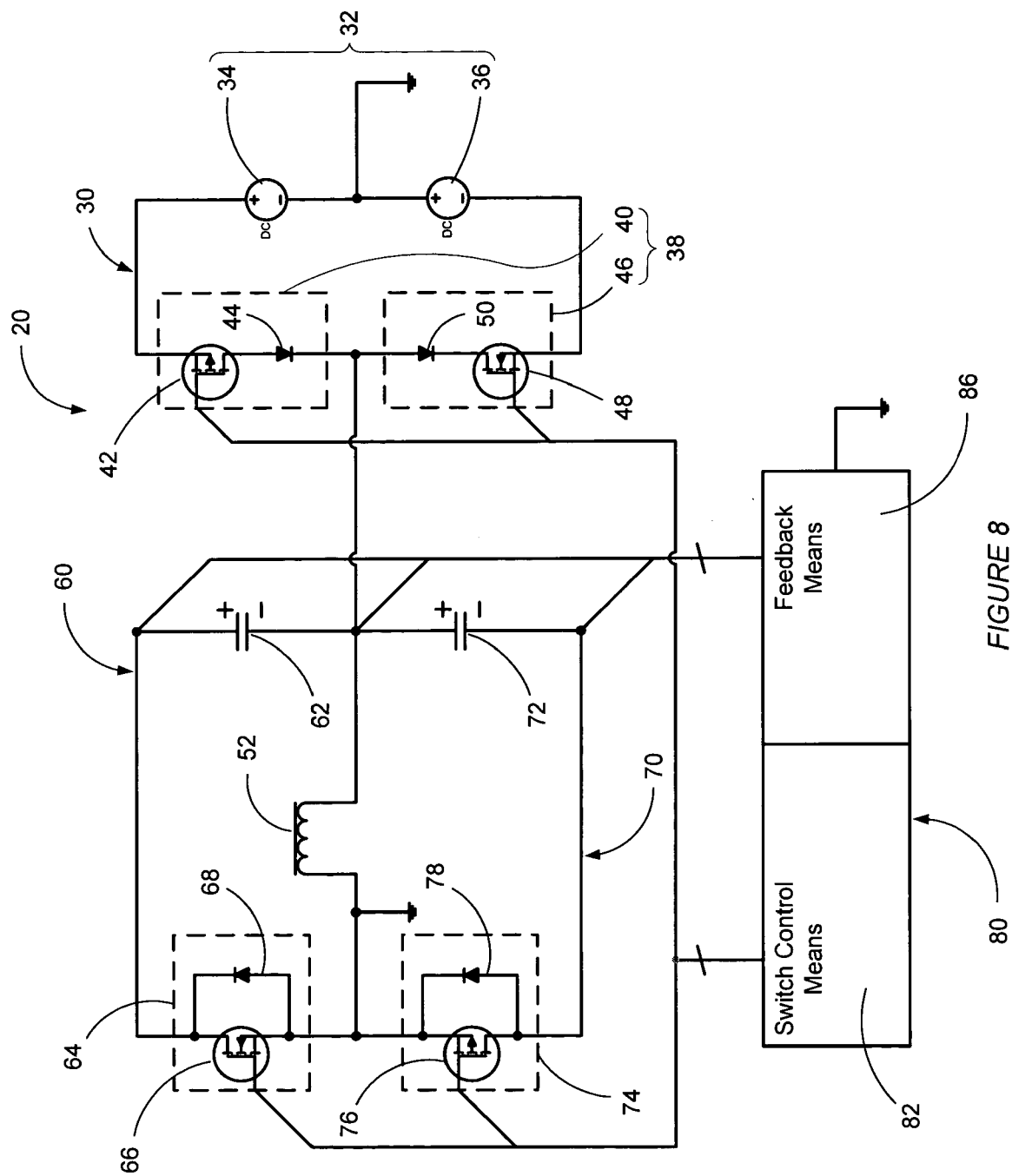
FIG. 8 is a detailed circuit diagram of the apparatus of FIG. 1.
Figure 9:
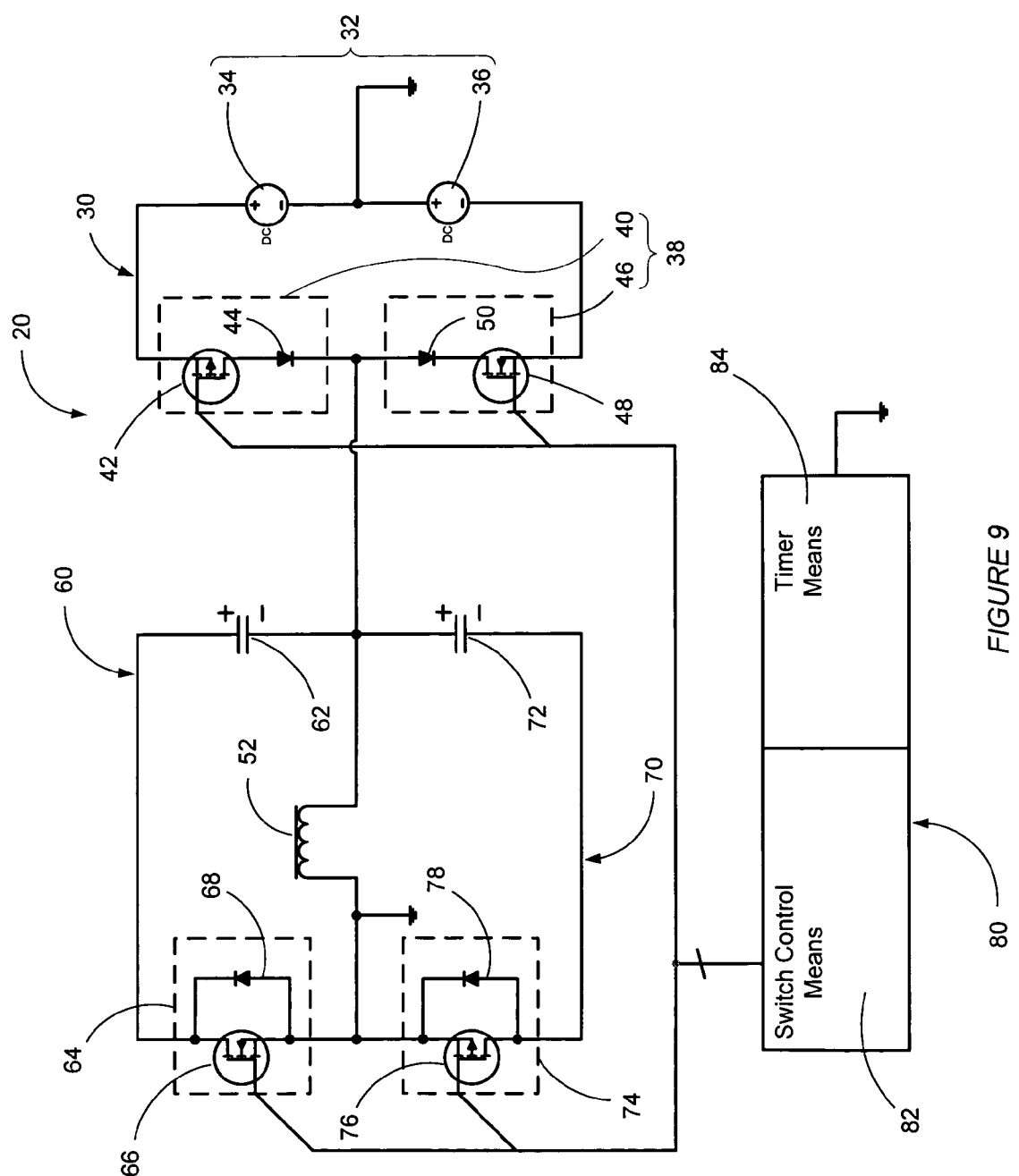
FIG. 9 is a detailed circuit diagram of a first alternate piezoelectric driving and switching apparatus according to the invention.

As best seen in FIGS. 8 and 9, the piezoelectric switching means 64 comprises piezoelectric manual and automatic switch portions 66, 68. The piezoelectric manual switch portion 66 may be a bipolar transistor, a MOSFET, an IGBT, a bilateral switch, an analog switch, a relay, an SCR, or a Triac circuit. As shown in FIGS. 8 and 9, the piezoelectric automatic switch portion 68 is preferably a diode in parallel with the piezoelectric manual switch portion 66.

The capacitive switching means 74 is used to control the flow of energy between the inductor 52 and the capacitive load 72. The capacitive load 72 is preferably a second piezoelectric load. The state and timing of the capacitive switching means 74 determines the amount and direction of energy transferred to and from the capacitive load 72. As shown in FIG. 1, the capacitive switching means 74 is controlled via the controller circuit 80 and it is operated as either fully open or fully closed. As with the supply and piezoelectric switching means 38, 64, switch signals to the capacitive switching means 74 are ground referenced, and limited to the maximum positive and negative voltages of the split power supply 32. The need for isolated control circuitry and a buffered high voltage interface is eliminated in this system.

As best seen in FIGS. 8 and 9, the capacitive switching means 74 comprises capacitive manual and automatic switch portions 76, 78. The capacitive manual switch portion 76 may be a bipolar transistor, a MOSFET, an IGBT, a bilateral switch, an analog switch, a relay, an SCR, or a Triac circuit. As shown in FIGS. 8 and 9, the capacitive automatic switch portion 78 is preferably a diode in parallel with the capacitive manual switch portion 76.

The controller circuit 80 is used to determine the switching state and timing of the supply switching means 38, the piezoelectric switching means 64, and the capacitive switching means 74. Measurement signals from the piezoelectric and capacitive loads 62, 72 and from the inductor 52 are utilized by a feedback means 86 of the controller circuit 80 to optimize a switch control means 82 thereof, as well as the energy transfer throughout the system. The controller circuit 80 may be powered from one of the two halves of the ground referenced low voltage power supply 32. Switch signals from the switch control means 82 are interfaced directly to the control lines of the power supply, piezoelectric, and capacitive circuits 30, 60, 70, without any need for isolation or a high voltage buffered interface. The controller circuit may have a circuit design of a microprocessor, a microcontroller, a digital signal processor, a CPLD, an FPGA, an ASIC, a discrete digital logic circuit, a discrete analog logic circuit, and a mixed digital and analog circuit.

FIG. 1 depicts a basic circuit diagram of a preferred embodiment of the apparatus 20. The apparatus 20 will be seen to include the dual polarity low voltage power supply 32 with its positive supply portion 34 and negative supply portion 36, the inductor 52, the first piezoelectric load 62, the capacitive load 72, the positive switching means 40, the negative switching means 46, the piezoelectric switching means 64, the capacitive switching means 74, the feedback means 86, and the switch control means 82.

The controller circuit 80 is given commands dictating the voltages required on the first piezoelectric load 62 and on the capacitive load 72. Using information provided to the feedback means 86 by the measurement signals, the switch control means 82 of the controller circuit 80 sends appropriate switch signals to produce the required voltages on the two loads 62, 72. To accomplish this, the controller circuit 80 uses four modes of control. Each mode consists of two events performed in sequence. Note that the polarity indicated on the inductor 52 is shown for reference purposes only and need not necessarily represent the actual polarity of the voltage across it.

Figure 2A:
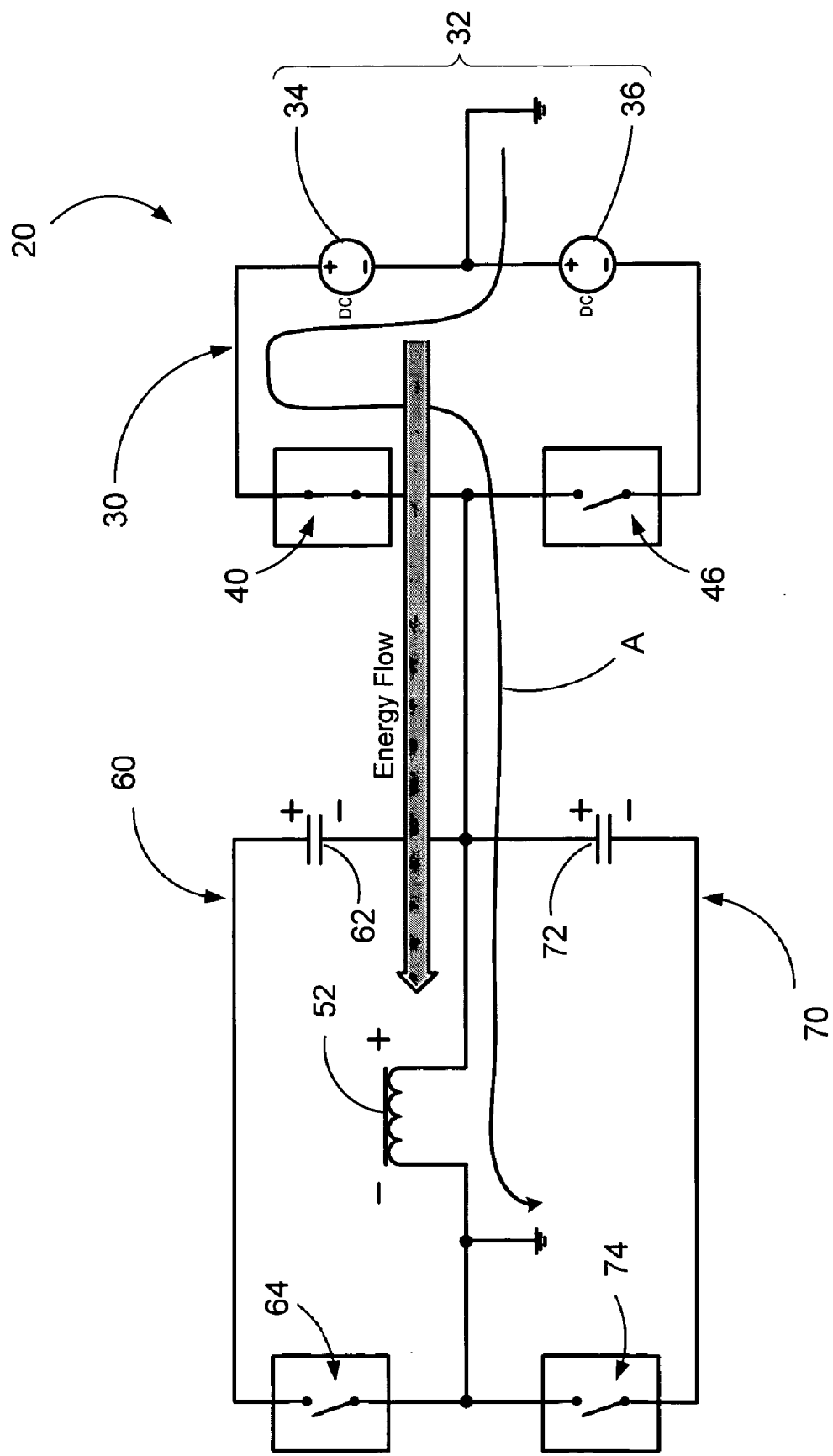
FIG. 2A is a basic circuit diagram of the apparatus of FIG. 1 shown without the controller circuit, and showing energy transfer in the positive current direction from the power supply to the inductor.
Figure 2B:
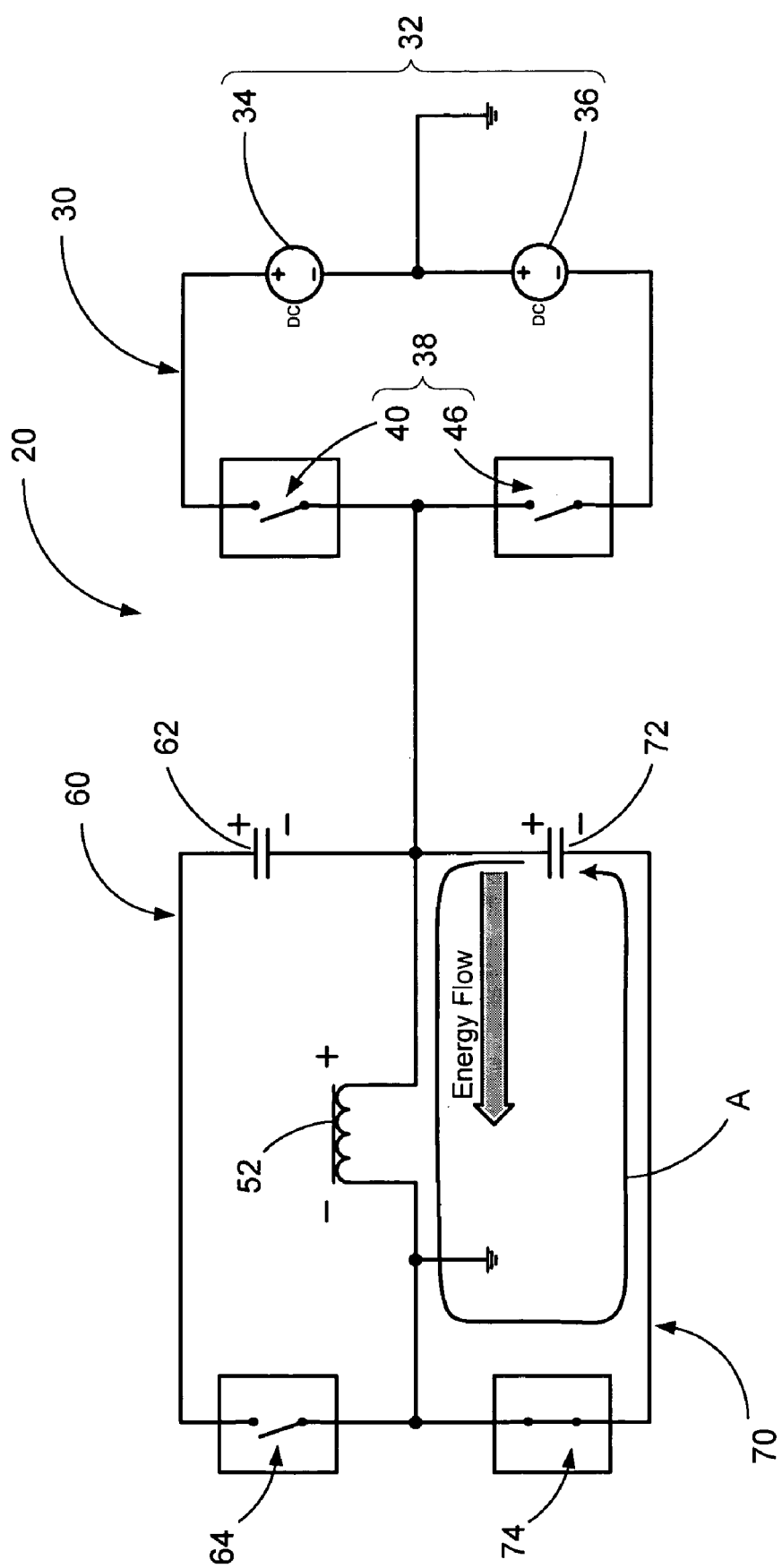
FIG. 2B is a diagram similar to FIG. 2A, showing energy transfer from the capacitive load to the inductor.
Figure 2C:
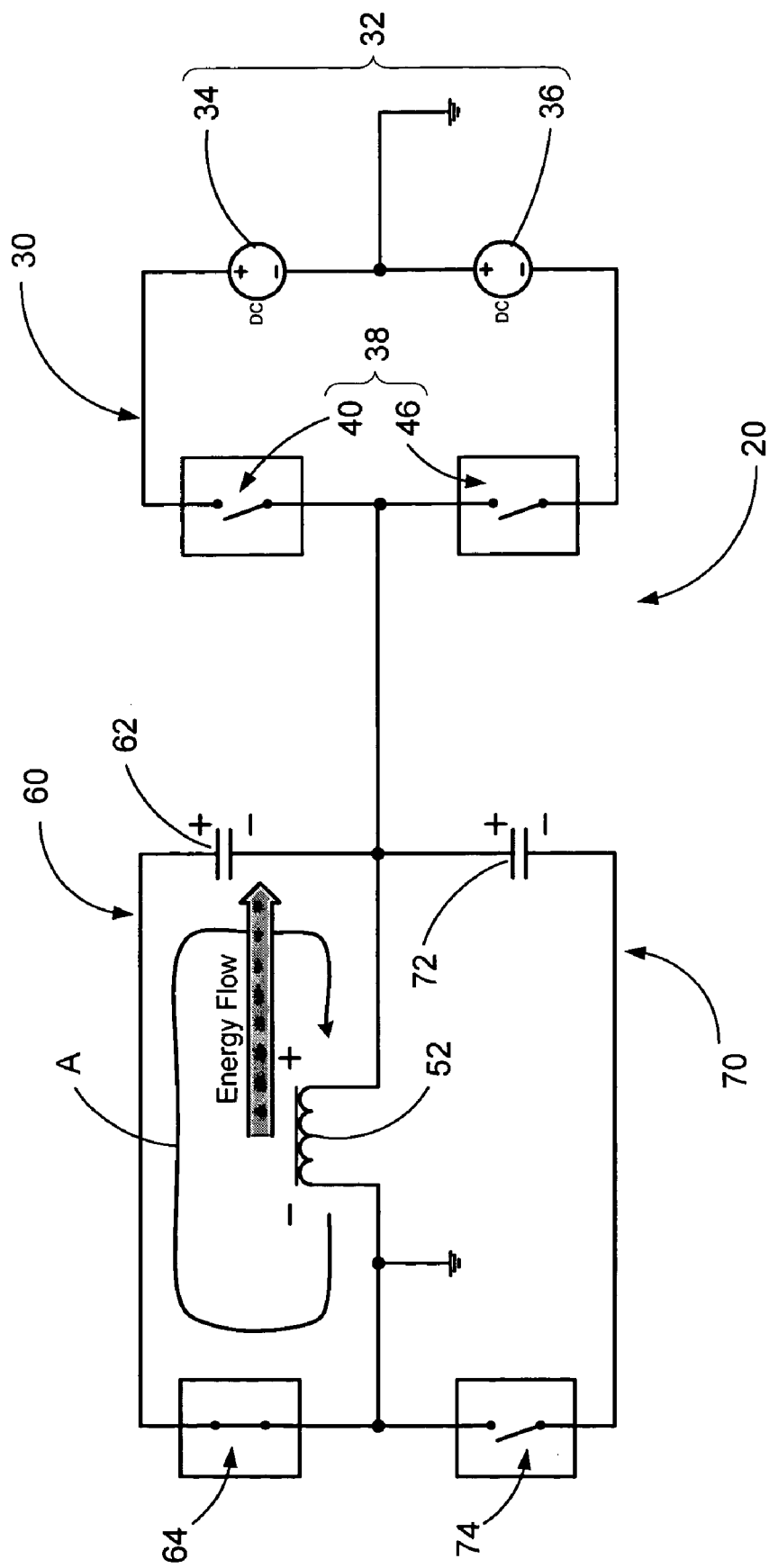
FIG. 2C is a diagram similar to FIG. 2A, showing energy transfer from the inductor to the first piezoelectric load.

FIGS. 2A and 2C collectively detail a first mode of control, namely, transfer of energy from the power supply 32 to the first piezoelectric load 62. In this mode an amount of energy is preferably transferred from the positive supply portion 34 to the first piezoelectric load 62 through the inductor 52. FIG. 2A shows the flow of energy during the first event of this mode. The controller circuit 80 switches the positive supply portion 34 of the power supply 32 to a positive closed circuit configuration causing a positive direction current flow (as indicated generally by arrow "A" in FIG. 2A) to flow through the inductor 52 and transferring energy to it. After the required time has elapsed to transfer the desired energy, the power supply 32 is switched to a supply open circuit configuration by the controller circuit 80 (as best seen in FIG. 2C). FIG. 2C shows the flow of energy during the second event of this mode. The second event is initiated by switching the power supply 32 to the supply open circuit configuration. At this point a build up of voltage across the inductor 52 causes the piezoelectric automatic switch portion 68 to switch the piezoelectric circuit 60 to a piezoelectric closed circuit configuration (best seen in FIG. 2C), forcing the positive direction current flow (as indicated generally by arrow "A") to flow into the first piezoelectric load 62 and transferring energy to it. The second event is completed once all the energy in the inductor 52 has been transferred to the first piezoelectric load 62 at which point the voltage across the inductor 52 drops to zero and causes the piezoelectric circuit 60 to switch to a piezoelectric open circuit configuration. This completes one first mode transfer of energy from the power supply 32 to the first piezoelectric load 62.

Figure 3A:
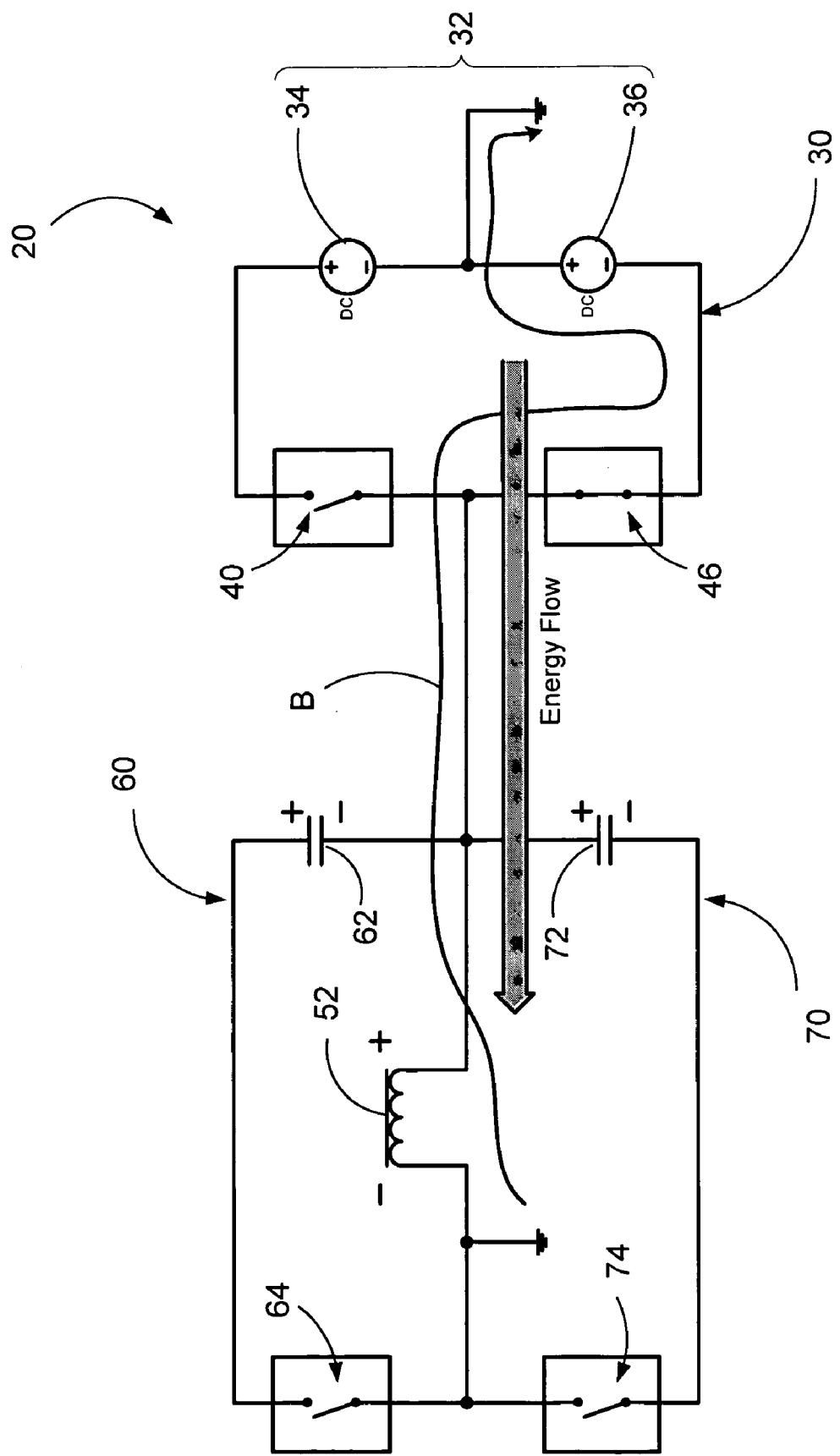
FIG. 3A is a diagram similar to FIG. 2A, showing energy transfer in the negative current direction from the power supply to the inductor.
Figure 3B:
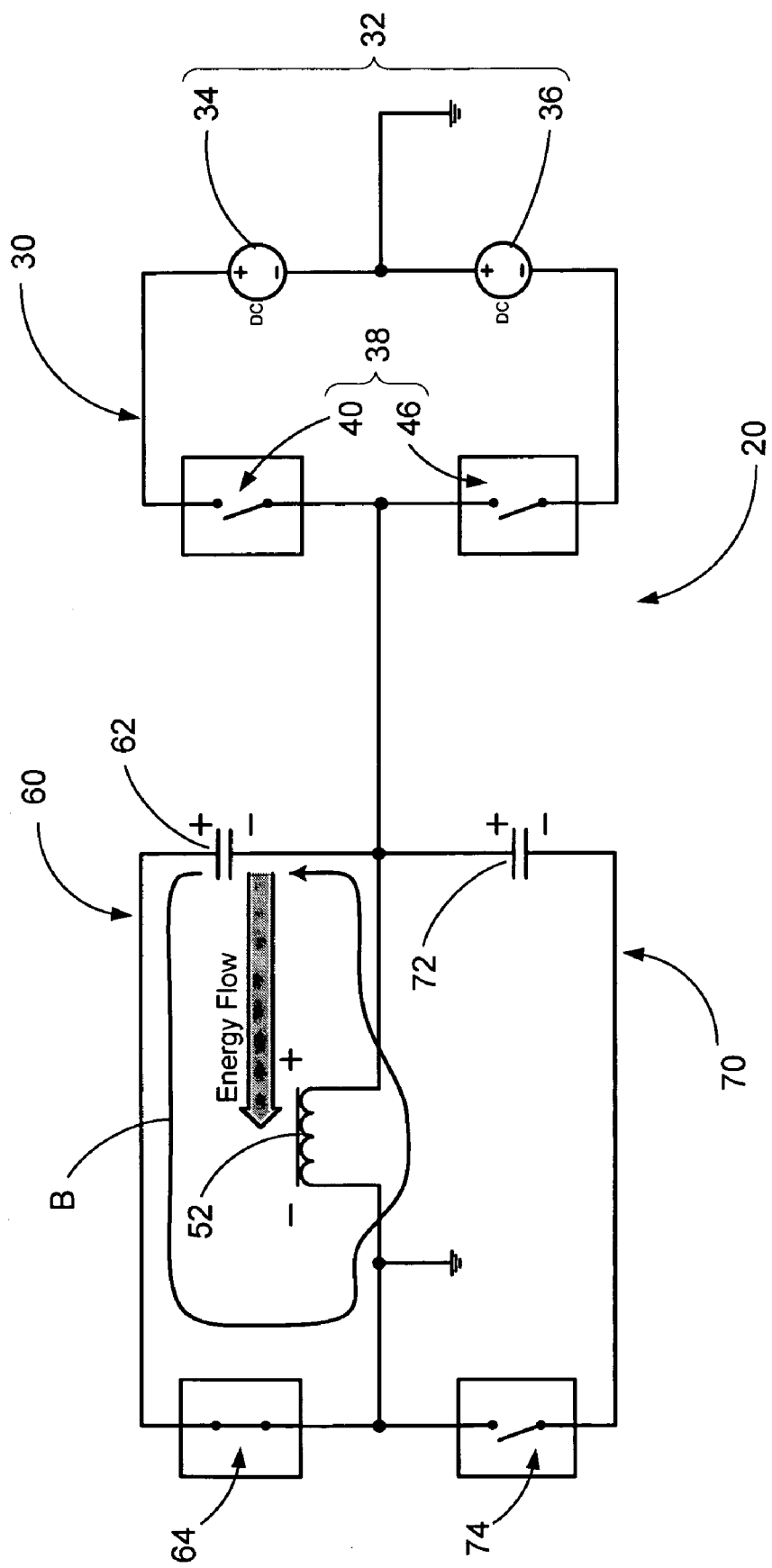
FIG. 3B is a diagram similar to FIG. 3A, showing energy transfer from the first piezoelectric load to the inductor.
Figure 3C:
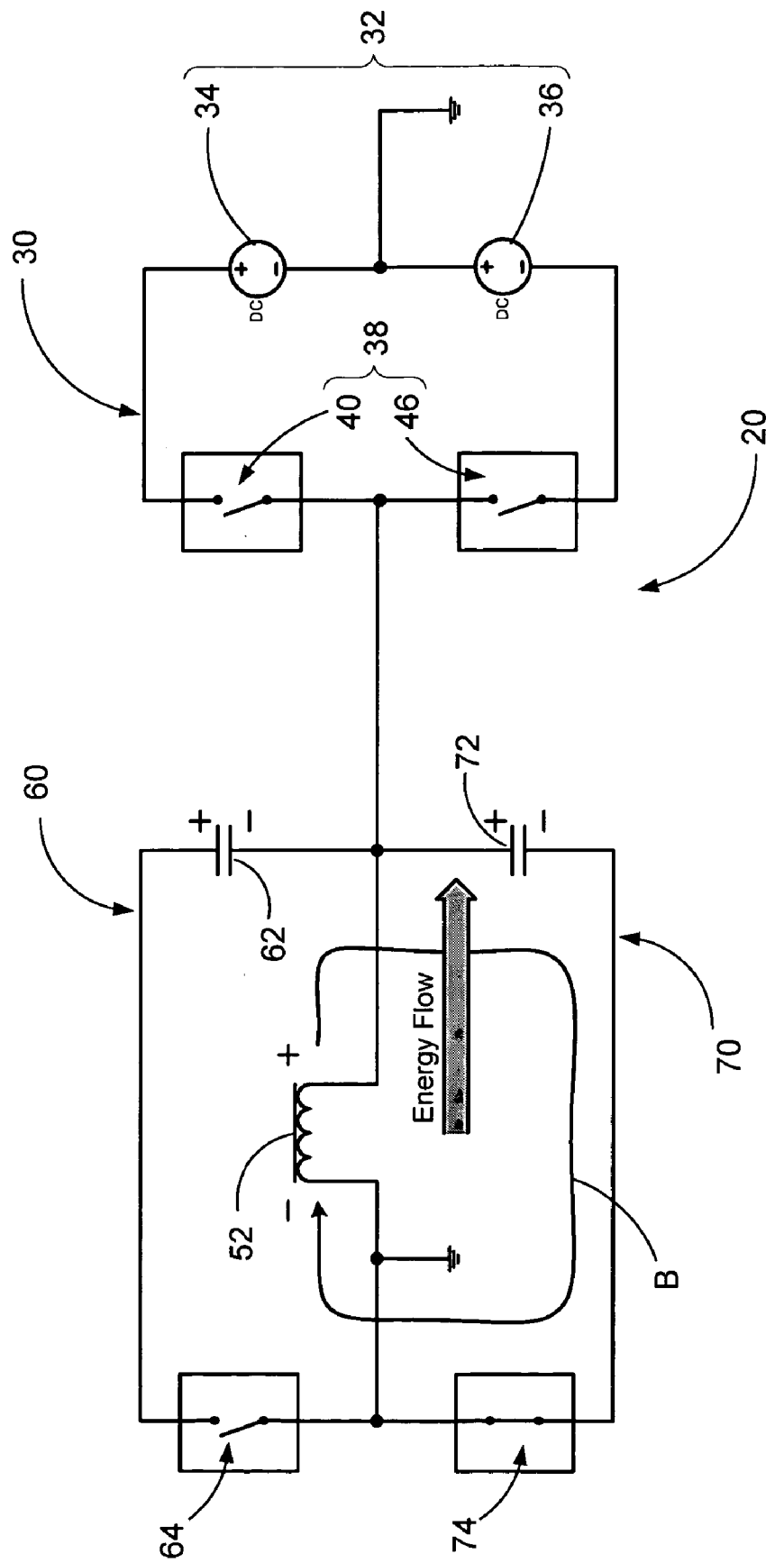
FIG. 3C is a diagram similar to FIG. 3A, showing energy transfer from the inductor to the capacitive load.

FIGS. 3A and 3C collectively detail a second mode of control, namely, transfer of energy from the power supply 32 to the capacitive load 72. In this mode an amount of energy is preferably transferred from the negative supply portion 36 to the capacitive load 72 through the inductor 52. FIG. 3A shows the flow of energy during the first event of this mode. The controller circuit 80 switches the negative supply portion 36 of the power supply 32 to a negative closed circuit configuration causing a negative direction current flow (as indicated generally by arrow "B" in FIG. 3A) to flow through the inductor 52 and transferring energy to it. After the required time has elapsed to transfer the desired energy, the power supply 32 is switched to a supply open circuit configuration by the controller circuit 80 (as best seen in FIG. 3C). FIG. 3C shows the flow of energy during the second event of this mode. The second event is initiated by switching the power supply 32 to the supply open circuit configuration. At this point a build up of voltage across the inductor 52 causes the capacitive automatic switch portion 78 to switch the capacitive circuit 70 to a capacitive closed circuit configuration (best seen in FIG. 3C), forcing the negative direction current flow (as indicated generally by arrow "B") to flow into the capacitive load 72 and transferring energy to it. The second event is completed once all the energy in the inductor 52 has been transferred to the capacitive load 72 at which point the voltage across the inductor 52 drops to zero and causes the capacitive circuit 70 to switch to a capacitive open circuit configuration. This completes one second mode transfer of energy from the power supply 32 to the capacitive load 72.

Figure 6:
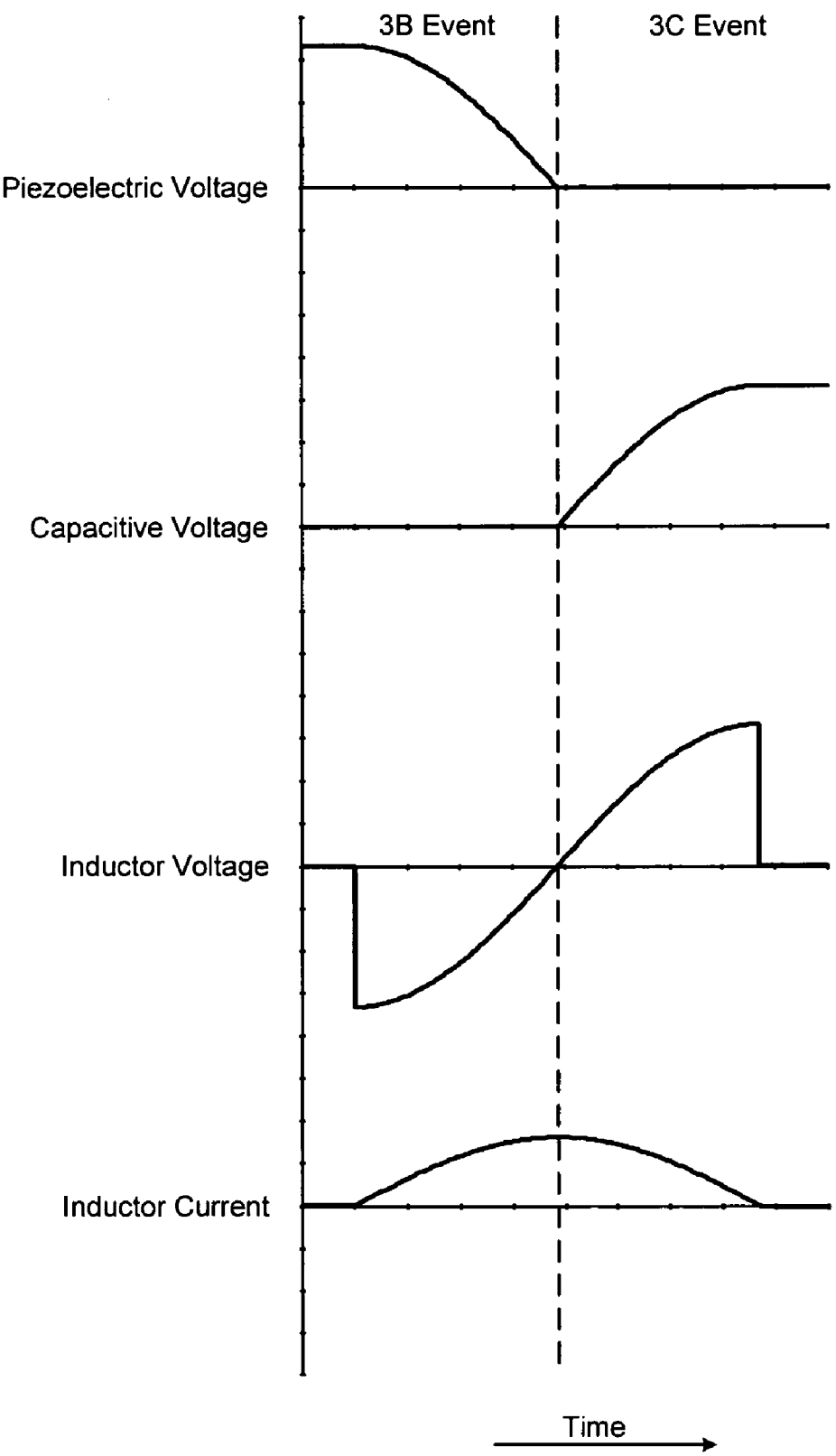
FIG. 6 is a graph of piezoelectric and capacitive voltage, and inductor voltage and current during the events represented by FIGS. 3B and 3C.

FIGS. 3B and 3C collectively detail a third mode of control, namely, transfer of energy from the first piezoelectric load 62 to the capacitive load 72. In this mode, at least a portion of the energy stored in the first piezoelectric load 62 is transferred to the capacitive load 72 through the inductor 52. FIG. 3B shows the flow of energy during the first event of this mode. The controller circuit 80 turns on the piezoelectric manual switch portion 66 thus switching the piezoelectric circuit 60 to the piezoelectric closed circuit configuration (best seen in FIG. 3B) and causing the negative direction current flow (as indicated generally by arrow "B" in FIG. 3B) to flow through the inductor 52 and transferring energy to it from the first piezoelectric load 62. The piezoelectric manual switch portion 66 is turned off by the controller circuit 80 once the desired amount of energy has been transferred to the inductor 52, such that the piezoelectric circuit 60 returns to the piezoelectric open circuit configuration (shown in FIG. 3C). The amount of time the piezoelectric circuit 60 is in the piezoelectric closed circuit configuration may be determined in a variety of ways and includes, but is not limited to, the following methods. The voltage across the first piezoelectric load 62 may be monitored using electric potential measurement signals received by the feedback means 86 and the piezoelectric circuit 60 is switched to the piezoelectric open circuit configuration when this voltage reaches a desired value. If the entire energy is to be transferred, as indicated by FIG. 6 (which is discussed in further detail hereinbelow), then monitoring the voltage across the inductor 52 by way of the electric potential measurement signals may also be used. In this case piezoelectric circuit 60 is switched to the piezoelectric open circuit configuration when this voltage reaches zero. Also, a calculated or fixed time delay may be used without any voltage monitoring, and FIG. 9 depicts an alternate embodiment of the apparatus 20, wherein the controller circuit 80 comprises a timer means 84 that completely replaces the feedback means 86.

FIG. 3C shows the flow of energy during the second event of the third mode, which is in most respects similar to the second event of the second mode (discussed above). The second event of the third mode, however, is initiated by switching the piezoelectric circuit 60 to the piezoelectric open circuit configuration. At this point a build up of voltage across the inductor 52 causes the capacitive automatic switch portion 78 to switch the capacitive circuit 70 to the capacitive closed circuit configuration (best seen in FIG. 3C), forcing the negative direction current flow "B" to flow into the capacitive load 72 and transferring energy to it. The second event is completed once all the energy in the inductor 52 has been transferred to the capacitive load 72 at which point the voltage across the inductor 52 drops to zero and causes the capacitive circuit 70 to switch to a capacitive open circuit configuration. This completes one third mode transfer of energy from the first piezoelectric load 62 to the capacitive load 72.

Figure 7:
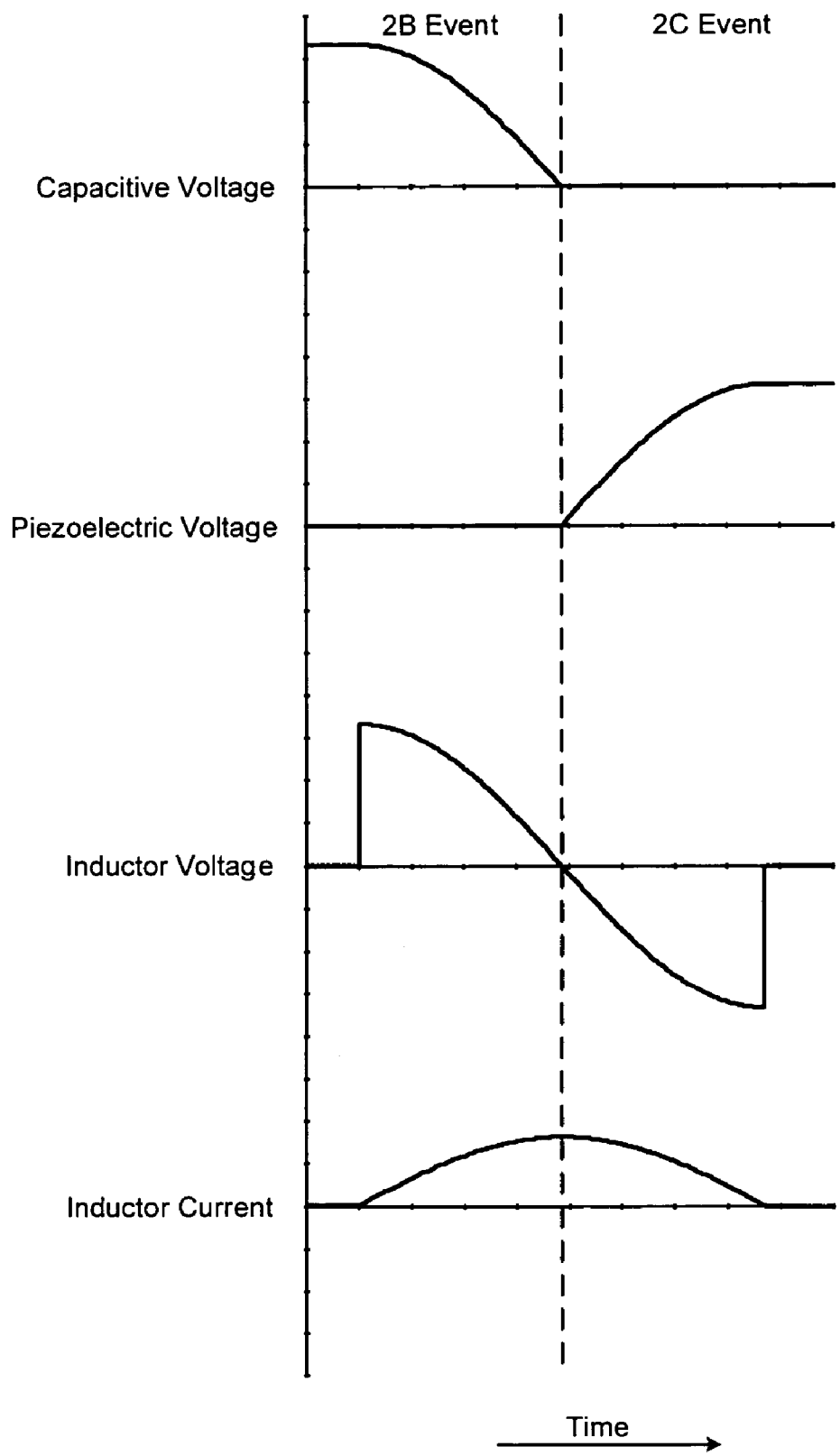
FIG. 7 is a graph similar to FIG. 6 during the events represented by FIGS. 2B and 2C.

FIGS. 2B and 2C collectively detail a fourth mode of control, namely, transfer of energy from the capacitive load 72 to the first piezoelectric load 62. In this mode, at least a portion of the energy stored in the capacitive load 72 is transferred to the first piezoelectric load 62 through the inductor 52. FIG. 2B shows the flow of energy during the first event of this mode. The controller circuit 80 turns on the capacitive manual switch portion 76 thus switching the capacitive circuit 70 to the capacitive closed circuit configuration (best seen in FIG. 2B) and causing the positive direction current flow (as indicated generally by arrow "A") to flow through the inductor 52 and transferring energy to it from the capacitive load 72. The capacitive manual switch portion 76 is turned off by the controller circuit 80 once the desired amount of energy has been transferred to the inductor 52, such that the capacitive circuit 70 returns to the capacitive open circuit configuration. (shown in FIG. 2C). The amount of time the capacitive circuit 70 is in the capacitive closed circuit configuration may be determined in a variety of ways and includes, but is not limited to, the following methods. The voltage across the capacitive load 72 may be monitored using electric potential measurement signals received by the feedback means 86 and the capacitive circuit 70 is switched to the capacitive open circuit configuration when this voltage reaches a desired value. If the entire energy is to be transferred, as indicated by FIG. 7 (which is discussed in further detail hereinbelow), then monitoring the voltage across the inductor 52 by way of the electric potential measurement signals may also be used. In this case the capacitive circuit 70 is switched to the capacitive open circuit configuration when this voltage reaches zero. Also, a calculated or fixed time delay may be used without any voltage monitoring, and as discussed above, FIG. 9 depicts such an alternate embodiment of the apparatus 20.

FIG. 2C shows the flow of energy during the second event of the fourth mode, which is in most respects similar to the second event of the first mode (discussed above). The second event of the fourth mode, however, is initiated by switching the capacitive circuit 70 to the capacitive open circuit configuration. At this point a build up of voltage across the inductor 52 causes the piezoelectric automatic switch portion 68 to switch the piezoelectric circuit 60 to the piezoelectric closed circuit configuration (best seen in FIG. 2C), forcing the positive direction current flow "A" to flow into the first piezoelectric load 62 and transferring energy to it. The second event is completed once all the energy in the inductor 52 has been transferred to the first piezoelectric load 62 at which point the voltage across the inductor 52 drops to zero and causes the piezoelectric circuit 60 to switch to the piezoelectric open circuit configuration. This completes one fourth mode transfer of energy from the capacitive load 72 to the first piezoelectric load 62.

Figure 4:
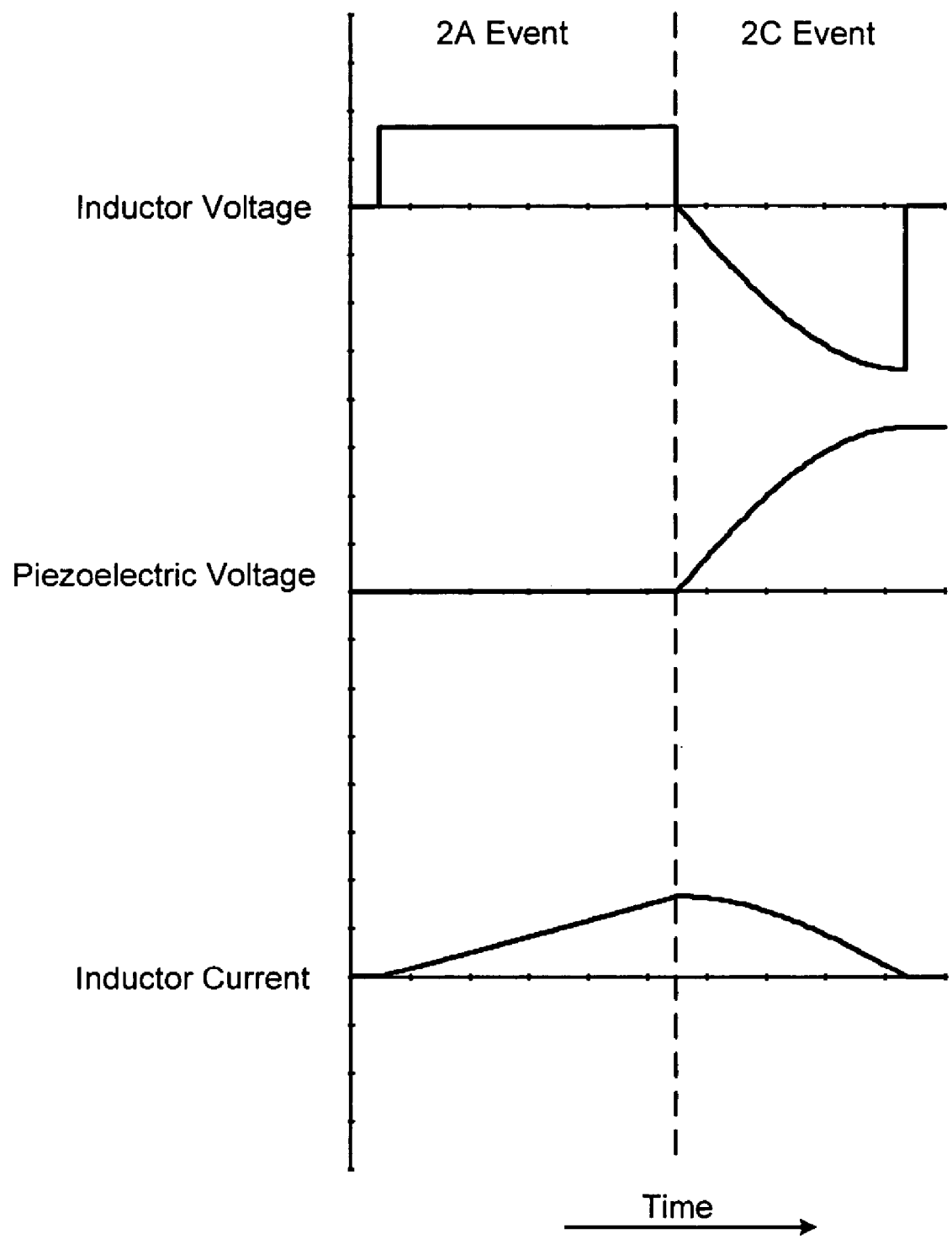
FIG. 4 is a graph of inductor voltage, piezoelectric voltage, and inductor current during the events represented by FIGS. 2A and 2C.
Figure 5:
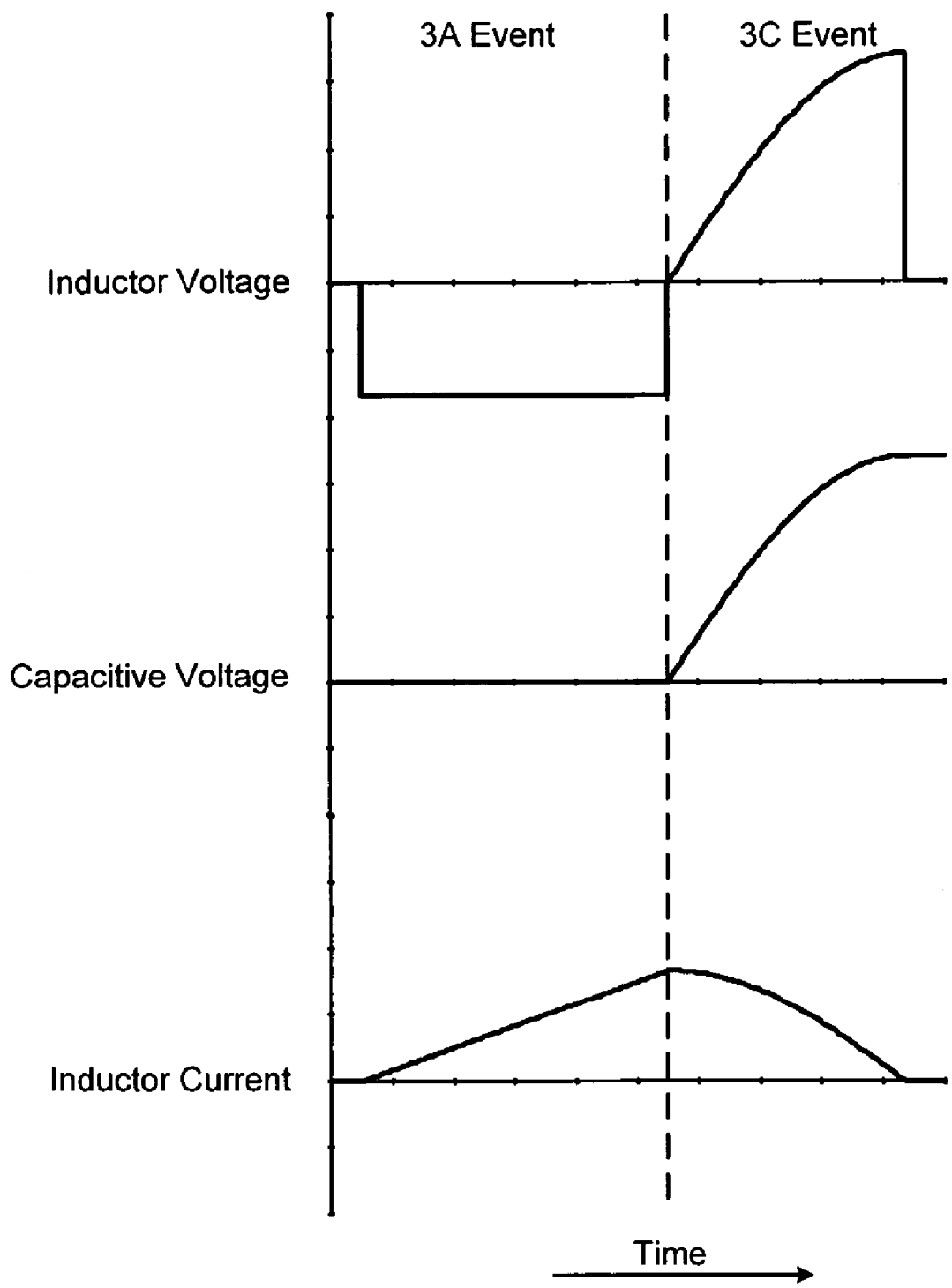
FIG. 5 is a graph of inductor voltage, capacitive voltage, and inductor current during the events represented by FIGS. 3A and 3C.

FIGS. 4 through 7 show typical voltage and current waveforms for the four modes of operation. The first mode of operation is shown in FIG. 4. The second mode of operation is shown in FIG. 5. FIG. 6 shows the third mode of operation in which all of the energy in the first piezoelectric load 62 is transferred to the capacitive load 72. FIG. 8 shows the fourth mode of operation in which all of the energy in the capacitive load is transferred to the first piezoelectric load 62.

FIG. 8 illustrates an embodiment of the present invention with MOSFETs and diodes comprising the various switches in the circuit. The piezoelectric manual switch portion 66 is preferably comprised of an N-channel MOSFET, and the piezoelectric automatic switch portion 68 is preferably comprised of a first diode in anti-parallel relation with the piezoelectric manual switch portion 66. The capacitive manual switch portion 76 is preferably comprised of a P-channel MOSFET, and the capacitive automatic switch portion 78 is preferably comprised of a second diode in anti-parallel relation with the capacitive manual switch portion 76. It is the anti-parallel diodes 68, 78 that allow these switches to be turned on and off automatically by the voltage developed across the inductor 52. The positive switching means 40 is comprised of a supply P-channel MOSFET 42 in series with a first blocking diode 44. The negative switching means 46 is comprised of a supply N-channel MOSFET 48 in series with a second blocking diode 50. The blocking diodes 44, 50 are required to prevent reverse currents from flowing through the intrinsic diodes in the bodies of the MOSFETS 42, 48.

Figure 10:
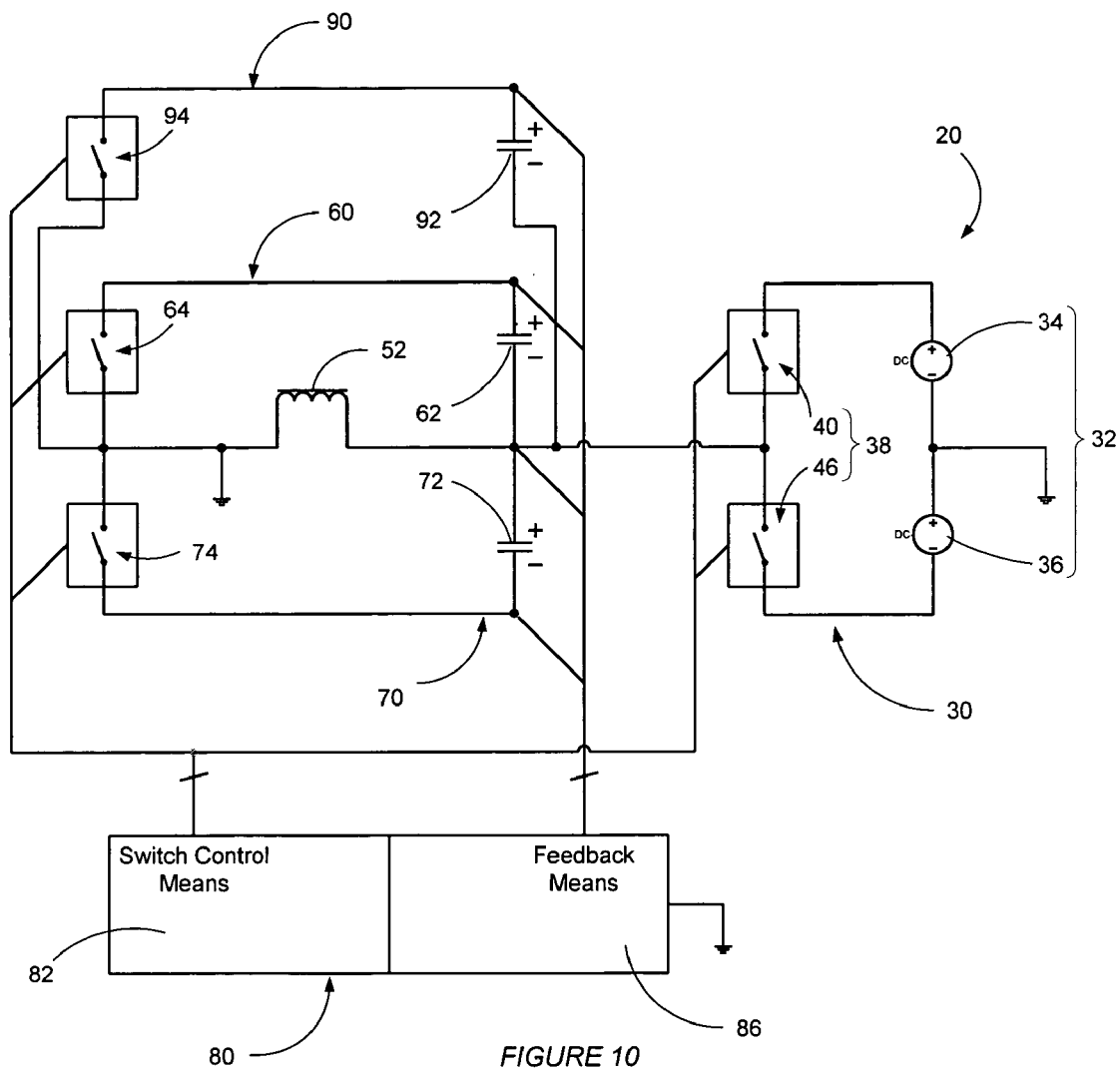
FIG. 10 is a detailed circuit diagram of a second alternate piezoelectric driving and switching apparatus according to the invention.

FIG. 10 depicts another alternate embodiment of the apparatus 20 that includes a third piezoelectric circuit 90. The third piezoelectric circuit 90 has a third piezoelectric load 92 electrically coupled to the inductor 52 and to a third piezoelectric switching means 94. The third piezoelectric circuit 90 is in parallel relation with each of the piezoelectric circuit 60 and the capacitive circuit 70. The third piezoelectric switching means 94 switches the third piezoelectric circuit between a third piezoelectric open circuit configuration (shown in FIG. 10), and a third piezoelectric closed circuit configuration (not shown). In the third piezoelectric closed circuit configuration, energy is transferable from the inductor 52 to the third piezoelectric circuit load 92. According to the alternate embodiment shown in FIG. 10, each of the first piezoelectric load 62, the capacitive load 72 (i.e., the second piezoelectric load), and the third piezoelectric load 92 may be a monomorph bender or a bending portion of a bimorph bender. From FIG. 10, it will be appreciated that the apparatus 20 may easily be used as a multimorph piezoelectric drive and switching apparatus.

As to a further discussion of the manner of usage and operation of the present invention, the same should be apparent from the above description. Accordingly, no further discussion relating to the manner of usage and operation will be provided.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention. That is, other modifications and alterations may be used in the design and manufacture of the according to the present invention without departing from the spirit and scope of the invention, which is limited only by the accompanying claims.

We claim:

1. A piezoelectric driving and switching apparatus comprising:
   a) a power supply circuit comprising an inductor electrically coupled to a low voltage power supply having ground referenced positive and negative supply portions, and to a supply switching means for switching said power supply circuit between a supply open circuit configuration, a positive closed circuit configuration whereat a positive electric potential is applied to said inductor so as to force a positive direction current flow through said inductor and so as to transfer an energy thereto, and a negative closed circuit configuration whereat a negative electric potential is applied to said inductor so as to force a negative direction current flow through said inductor and so as to transfer said energy thereto;
   b) a piezoelectric circuit comprising a first piezoelectric load electrically coupled to said inductor and to a piezoelectric switching means for switching said piezoelectric circuit between a piezoelectric open circuit configuration, and a piezoelectric closed circuit configuration whereat said energy is transferable from said inductor to said piezoelectric load when a first direction current flow of said positive direction current flow and said negative direction current flow is produced in said inductor, and whereat said energy is transferable from said piezoelectric load to said inductor when a respective other direction current flow of said positive direction current flow and said negative direction current flow is produced in said inductor;
   c) a capacitive circuit comprising a capacitive load electrically coupled to said inductor and to a capacitive switching means for switching said capacitive circuit between a capacitive open circuit configuration, and a capacitive closed circuit configuration whereat said energy is transferable from said inductor to said capacitive load when said respective other direction current flow is produced in said inductor, and whereat said energy is transferable from said capacitive load to said inductor when said first direction current flow is produced in said inductor;
   d) a controller circuit comprising a switch control means for transmitting low voltage ground referenced switch signals to said supply switching means, said piezoelectric switching means, and said capacitive switching means so as to selectively and independently transfer:
      i) said energy from said power supply to said first piezoelectric load;
      ii) a portion of said energy from said capacitive load to said first piezoelectric load;
      iii) said energy from said power supply to said capacitive load; and
      iv) a portion of said energy from said piezoelectric load to said capacitive load.

2. An apparatus according to claim 1 wherein, in transferring said portion of said energy from said first piezoelectric load to said capacitive load as aforesaid, said switch control means transmits a closing piezoelectric switch signal to said piezoelectric switch means such that said piezoelectric circuit is switched to said piezoelectric closed circuit configuration, said respective other direction current flow is produced in said inductor, and said portion of said energy is directly transferred from said piezoelectric load to said inductor, whereupon said switch control means transmits a piezoelectric opening switch signal to said piezoelectric switch means such that said piezoelectric circuit is switched to said piezoelectric open circuit configuration, whereupon said respective other direction current flow is produced in said inductor and said capacitive circuit is switched to said capacitive closed circuit configuration, such that said portion of said energy is directly transferred from said inductor to said capacitive load.

3. An apparatus according to claim 2 wherein, in transferring said portion of said energy from said capacitive load to said first piezoelectric load as aforesaid, said switch control means transmits a capacitive closing switch signal to said capacitive switch means such that said capacitive circuit is switched to said capacitive closed circuit configuration, said first direction current flow is produced in said inductor, and said portion of said energy is directly transferred from said capacitive load to said inductor, whereupon said switch control means transmits a capacitive opening switch signal to said capacitive switch means such that said capacitive circuit is switched to said capacitive open circuit configuration, whereupon said first direction current flow is produced in said inductor and said piezoelectric circuit is switched to said piezoelectric closed circuit configuration, such that said portion of said energy is directly transferred from said inductor to said piezoelectric load.

4. An apparatus according to claim 3 wherein, in transferring said energy from said power supply to said first piezoelectric load as aforesaid, said switch control means transmits a first closing switch signal to said supply switching means such that said power supply circuit is switched to a first supply closed circuit configuration of said positive closed circuit configuration and said negative closed circuit configuration, said first direction current flow is produced in said inductor, and said energy is transferred from said power supply to said inductor, whereupon said switch control means transmits a supply opening switch signal to said supply switching means such that said power supply circuit is switched to said supply open circuit configuration, whereupon said first direction current flow is produced in said inductor and said piezoelectric circuit is switched to said piezoelectric closed circuit configuration, such that said energy is transferred from said inductor to said first piezoelectric load.

5. An apparatus according to claim 4 wherein, in transferring said energy from said power supply to said capacitive load as aforesaid, said switch control means transmits a second closing switch signal to said supply switching means such that said power supply circuit is switched to a respective other supply closed circuit configuration of said positive closed circuit configuration and said negative closed circuit configuration, said respective other direction current flow is produced in said inductor, and said energy is transferred from said power supply to said inductor, whereupon said switch control means transmits a supply opening switch signal to said supply switching means such that said power supply circuit is switched to said supply open circuit configuration, whereupon said respective other direction current flow is produced in said inductor and said capacitive circuit is switched to said capacitive closed circuit configuration, such that said energy is transferred from said inductor to said capacitive load.

6. An apparatus according to claim 5, wherein said piezoelectric switching means comprises a piezoelectric manual switch portion adapted to receive said switch signals from said switch control means, and a piezoelectric automatic switch portion adapted to automatically switch said piezoelectric circuit to said piezoelectric closed circuit configuration, when said first direction current flow is produced in said inductor and said power supply circuit and said capacitive circuit are respectively in said supply open circuit configuration and said capacitive open circuit configuration.

7. An apparatus according to claim 6, wherein said capacitive switching means comprises a capacitive manual switch portion adapted to receive said switch signals from said switch control means, and a capacitive automatic switch portion adapted to automatically switch said capacitive switching circuit to said capacitive closed circuit configuration, when said respective other direction current flow is produced in said inductor and said power supply circuit and said capacitive circuit are respectively in said supply open circuit configuration and said capacitive open circuit configuration.

8. An apparatus according to claim 7, wherein said supply switching means comprises a positive switching means for switching said power supply circuit to said positive closed circuit configuration, and a negative switching means for switching said power supply circuit to said negative closed circuit configuration.

9. An apparatus according to claim 8, wherein said controller circuit further comprises a timer means electrically coupled to said switch control means for automatically and independently transmitting one of said piezoelectric opening switch signal, said capacitive opening switch signal, and said supply opening switch signal, following expiry of a measured time delay period in a corresponding one of said piezoelectric closed circuit configuration, said capacitive closed circuit configuration, and said first closed circuit configuration and said second closed circuit configuration.

10. An apparatus according to claim 8, wherein said controller circuit further comprises feedback means for transmitting low voltage ground referenced electric potential measurement signals in respect of each of said capacitor, said first piezoelectric load, and said capacitive load to said switch control means, and wherein, responsive to said electric potential measurement signals, said switch control means automatically and independently transmits one of said supply opening switch signal, said capacitive opening switch signal, and said piezoelectric opening switch signal.

11. An apparatus according to claim 10, wherein said piezoelectric manual switch portion is selected from the group consisting of a bipolar transistor, a field-effect transistor, a bilateral switch, an analog switch, a relay, a silicon controlled rectifier, and a triac circuit, and wherein said piezoelectric automatic switch portion comprises a first diode in anti-parallel relation with said piezoelectric manual switch portion.

12. An apparatus according to claim 11, wherein said capacitive manual switch portion is selected from the group consisting of a bipolar transistor, a field-effect transistor, a bilateral switch, an analog switch, a relay, a silicon controlled rectifier, and a triac circuit, and wherein said capacitive automatic switch portion comprises a second diode in anti-parallel relation with said capacitive manual switch portion.

13. An apparatus according to claim 12, wherein said piezoelectric manual switch portion comprises said field-effect transistor, namely, a first MOSFET.

14. An apparatus according to claim 13, wherein said capacitive manual switch portion comprises said field-effect transistor, namely, a second MOSFET.

15. An apparatus according to claim 14, wherein said first MOSFET comprises an N-channel MOSFET such that said first direction current flow comprises said positive direction current flow, and such that said first supply closed circuit configuration comprises said positive closed circuit configuration, and wherein said second MOSFET comprises a P-channel MOSFET such that said respective other direction current flow comprises said negative direction current flow, and such that said first supply closed circuit configuration comprises said negative closed circuit configuration.

16. An apparatus according to claim 15, wherein said positive switching means comprises a P-channel MOSFET in series relation with a first blocking diode, and wherein said negative switching means comprises an N-channel MOSFET in series relation with a second blocking diode.

17. An apparatus according to claim 16, wherein said capacitive load comprises a second piezoelectric load.

18. An apparatus according to claim 17, wherein said first piezoelectric load comprises a first bending portion of a bimorph bender and said second piezoelectric load comprises a second bending portion of said bimorph bender.

19. An apparatus according to claim 17, further comprising at least a third piezoelectric circuit comprising a third piezoelectric load electrically coupled to said inductor in parallel relation with said piezoelectric circuit and said capacitive circuit, and having a third piezoelectric switching means for switching said third piezoelectric circuit between a third piezoelectric open circuit configuration, and a third piezoelectric closed circuit configuration whereat said energy is transferable from said inductor to said third piezoelectric circuit load, and wherein each of said first piezoelectric load, said second piezoelectric load, and said third piezoelectric load is selected from the group consisting of a monomorph bender and a bending portion of a bimorph bender.

20. An apparatus according to claim 17, wherein said first piezoelectric load comprises a first monomorph bender and said second piezoelectric load comprises a second monomorph bender.

21. An apparatus according to claim 20, wherein said controller circuit has a circuit design selected from the group consisting of a microprocessor, a microcontroller, a digital signal processor, a complex programmable logic device, a field-programmable gate array, an application-specific integrated circuit, a discrete digital logic circuit, a discrete analog logic circuit, and a mixed digital and analog circuit.

22. An apparatus according to claim 21, wherein each of said positive and negative supply portions of said power supply switching circuit further comprises a respective supply capacitor electrically coupled between said power supply and said inductor.

23. An apparatus according to claim 22, wherein said low voltage power supply comprises a split direct current power supply.

* * * * *